US012707651B2

(12) United States Patent
Heo et al.

(10) Patent No.: US 12,707,651 B2
(45) Date of Patent: Aug. 11, 2026

(54) HYBRID MEMORY DEVICE AND ELECTRONIC DEVICE INCLUDING SAME

(71) Applicant: Samsung Electronics Co., Ltd., Suwon-si (KR)

(72) Inventors: Jinseong Heo, Seoul (KR); Hagyoul Bae, Suwon-si (KR); Seunggeol Nam, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 681 days.

(21) Appl. No.: 18/055,485

(22) Filed: Nov. 15, 2022

(65) Prior Publication Data

US 2023/0157037 A1 May 18, 2023

(30) Foreign Application Priority Data

Nov. 17, 2021 (KR) ........................ 10-2021-0158833
Oct. 12, 2022 (KR) ........................ 10-2022-0130918

(51) Int. Cl.
*H10B 99/00* (2023.01)

(52) U.S. Cl.
CPC .................................... *H10B 99/00* (2023.02)

(58) Field of Classification Search
CPC ........ H10B 99/00; H10B 51/10; H10B 51/30; H10B 51/20; H10D 30/47; H10D 64/518; H10D 30/0415; H10D 30/701; H10D 64/033

See application file for complete search history.

(56) References Cited

U.S. PATENT DOCUMENTS 10,008,265 B2 6/2018 Hsu
2004/0061153 A1 4/2004 Misewich et al.
2007/0045719 A1* 3/2007 Wang ..................... H10D 30/69 257/E29.302
2008/0157183 A1* 7/2008 Hayakawa ........... H10D 30/693 257/E21.21
2015/0100532 A1* 4/2015 Yamaguchi ............ G06N 3/063 706/33
2016/0155855 A1* 6/2016 Ramaswamy ......... H10D 84/82 257/295
2016/0225860 A1 8/2016 Karda et al.
2018/0019134 A1* 1/2018 Choi ...................... H10B 69/00
2021/0126013 A1* 4/2021 Lai ....................... H10D 30/025

FOREIGN PATENT DOCUMENTS

KR 10-2018-0007602 A 1/2018

* cited by examiner

*Primary Examiner* — William B Partridge
*Assistant Examiner* — Erik A. Anderson
(74) *Attorney, Agent, or Firm* — Harness, Dickey & Pierce, P.L.C.

(57) ABSTRACT

A hybrid memory device includes a first transistor including a first channel region, a first gate electrode facing and spaced apart from the first channel region, and a first memory layer arranged between the first channel region and the first gate electrode, and a second transistor including a second channel region including a same material as the first channel region, a second gate electrode facing and spaced apart from the second channel region, and a second memory layer arranged between the second channel region and the second gate electrode, wherein the hybrid memory device is used as a highly integrated memory system by two transistors that are formed on a same substrate and operate as different types of memories.

21 Claims, 15 Drawing Sheets

HYBRID MEMORY DEVICE AND ELECTRONIC DEVICE INCLUDING SAME

CROSS-REFERENCE TO RELATED APPLICATIONS

This application is based on and claims priority under 35 U.S.C. § 119 to Korean Patent Application Nos. 10-2021-0158833 and 10-2022-0130918, filed on Nov. 17, 2021 and Oct. 12, 2022, respectively, in the Korean Intellectual Property Office, the disclosures of each of which are incorporated by reference herein in their entireties.

BACKGROUND

Various example embodiments relate to a hybrid memory device and/or an electronic device including same.

Memory semiconductors refer to devices that memorize and store data by electrically controlling semiconductor circuits. Non-volatile or volatile memory performance is exhibited according to a type of memory material included in the memory semiconductors.

Dynamic Random Access Memory (DRAMs), which are volatile memory devices, generally includes memory cells having a one-transistor/one capacitor (1T/1C) structure—e.g., one transistor and one capacitor per memory cell. DRAMs have a high operation speed, but may be difficult to increase the integration thereof. In order to increase the integration of DRAMs and/or manufacture embedded chips together with other devices, a size of DRAM cells needs to be or are desired to be reduced, because it may be difficult to reduce a size of capacitors in response to a decrease in a size of transistors.

Flash memory devices, which are non-volatile memory devices, are easier to increase the integration thereof than DRAMs, and thus have a large storage capacity, but may have a slow operation speed.

DRAM and flash memory have been individually manufactured and used due to different structures, operation methods, and/or advantages/disadvantages, but as device scaling progresses, device characteristics deteriorate and integration is reaching limit thereof.

SUMMARY

Provided is a hybrid memory device in which different types of memories are combined.

Additional aspects will be set forth in part in the description which follows and, in part, will be apparent from the a review of various example embodiments, or may be learned by practice of various example embodiments.

According to some example embodiments, a hybrid memory device includes a first transistor including a first channel region, a first gate electrode facing and spaced apart from the first channel region, and a non-volatile first memory layer between the first channel region and the first gate electrode. The hybrid memory device may include a second transistor including a second channel region including a same material as the first channel region, a second gate electrode facing and spaced apart from the second channel region, and a volatile second memory layer between the second channel region and the second gate electrode.

The first transistor may be configured to operate as a flash memory device or flash memory cell, and the second transistor may be configured to operate as a dynamic random access memory (DRAM) device or DRAM cell.

The first memory layer may include a ferroelectric material.

The hybrid memory device may be configured such that as the first transistor operates, a voltage, which is greater than or equal to a level generating polarization switching of the ferroelectric material, is applied to the first gate electrode.

The second memory layer may include at least one of a ferroelectric material, a paraelectric material, or a high-k material.

The hybrid memory device may be configured such that as the second transistor operates, a voltage, which has a level sufficient to generate an excess hole in the second channel region, is applied to a drain of the second transistor.

The first transistor may further include a first insulating layer between the first memory layer and the first channel region.

The second transistor may further include a second insulating layer between the second memory layer and the second channel region and including a same material as the first insulating layer.

The first channel region and the second channel region may include polycrystalline silicon (poly-Si), and the first insulating layer and the second insulating layer may include $SiO_2$.

Any one of or exactly one of a source and a drain of the first transistor and any one of or exactly one of a source and a drain of the second transistor may be shared.

The first channel region and the second channel region may correspond to vertical channels connected to each other in a second direction perpendicular to a first direction in which the first channel region and the first gate electrode are spaced apart from each other, and the first transistor and the second transistor may be arranged in the second direction.

The vertical channels may have a cylindrical shape having a height in the second direction, the first memory layer and the first gate electrode may have a shape surrounding the cylindrical shape, and the second memory layer and the second gate electrode may have a shape surrounding the cylindrical shape at a different height location.

The hybrid memory device may include a plurality of the first transistors, and a plurality of the second transistors, and the plurality of first transistors and the plurality of second transistors may be alternately arranged in the second direction.

The hybrid memory device may further include a substrate including a source electrode and a drain electrode spaced apart from each other, wherein the first channel region and the second channel region are spaced apart from each other between the source electrode and the drain electrode in the first direction away from the substrate.

The first memory layer may have a shape surrounding the first channel region, and the second memory layer may have a shape surrounding the second channel region.

The hybrid memory device may include a plurality of the first transistors and a plurality of the second transistors, and the plurality of first transistors and the plurality of second transistors may be alternately arranged in the first direction.

The ferroelectric material included in the first memory layer may include at least one of an oxide of hafnium (Hf) or an oxide of zirconium (Zr).

The ferroelectric material included in the first memory layer may further include, in the oxide, at least one of Si, Al, Y, La, Gd, Mg, Ca, Sr, Ba, Ti, Zr, Hf, or N as a dopant material.

The first channel region may include at least one of Si, Ge, SiGe, group III-V semiconductor, oxide semiconductor, nitride semiconductor, nitrogen oxide semiconductor, a two-dimensional (2D) material, a quantum dot, transition metal dichalcogenide, and organic semiconductor.

According to various example embodiments, an electronic device includes a memory cell, and a controller electrically connected to the memory unit and configured to control the memory cell, wherein at least one of the memory cell and the controller includes a hybrid memory device.

BRIEF DESCRIPTION OF THE DRAWINGS

The above and other aspects, features, and advantages of various example embodiments will be more apparent from the following description taken in conjunction with the accompanying drawings, in which.

DETAILED DESCRIPTION OF VARIOUS EXAMPLE EMBODIMENTS

Figure 1:
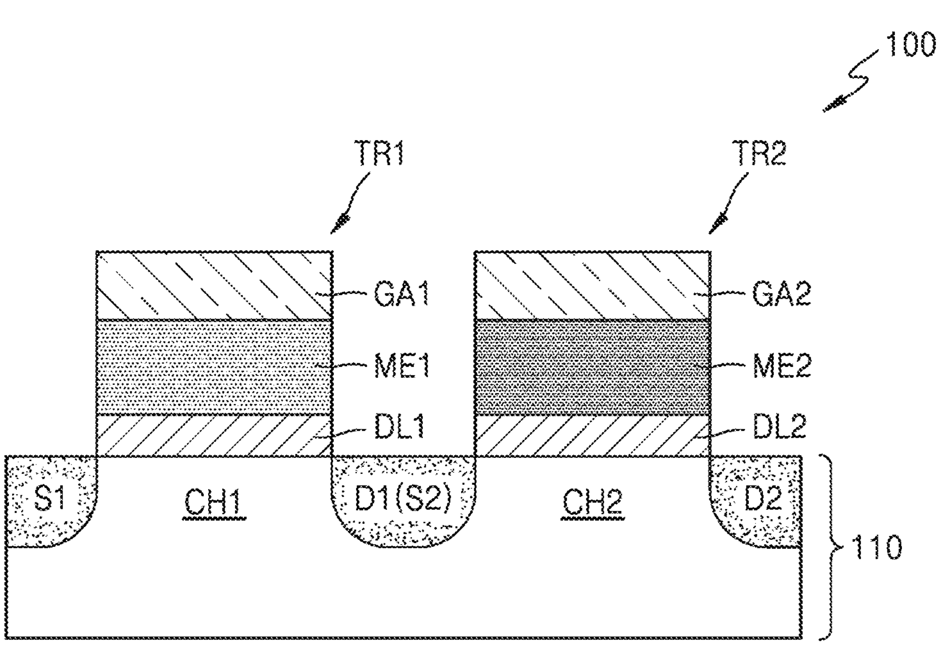
FIG. 1 is a cross-sectional view illustrating a schematic structure of a hybrid memory device according to some example embodiments.

Reference will now be made in detail to embodiments, examples of which are illustrated in the accompanying drawings, wherein like reference numerals refer to like elements throughout. In this regard, example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. The embodiments being described are merely examples, and various modifications may be made from example embodiments. In the drawings, like reference numerals denote like elements, and the sizes of the respective elements may be exaggerated for clarity and convenience of description.

Hereinafter, spatially relative terms, such as "above" or "on," may include those that are directly on in contact as well as those that are above non-contact.

Although the terms, "first", "second", etc. may be used herein to describe various elements, these terms are only used to distinguish one element from another. These terms do not limit differences between materials or structures of the elements.

The singular forms are intended to include the plural forms as well unless the context clearly indicates otherwise. In addition, when a unit "comprises or includes" an element, this means that the unit may further include other elements, rather than excluding other elements, unless otherwise stated.

Also, as used herein, the terms " . . . unit", "module", etc. refer to a unit that processes at least one function or operation, and the unit may be implemented as hardware, software, or a combination of hardware and software.

The use of the term "the" and similar indicative terms may correspond to both singular and plural.

Operations constituting a method may be performed in an appropriate order, unless explicitly stated that they should be performed in the order described. In addition, the use of all illustrative terms (e.g., etc.) is simply intended to describe the technical spirit in detail, and unless limited by claims, the scope of rights is not limited by these terms.

FIG. 1 is a cross-sectional view illustrating a schematic structure of a hybrid memory device according to some example embodiments.

A hybrid memory device 100 is or includes a memory device in which different types of memory operations are integrally performed, and includes a first transistor TR1 and a second transistor TR2. The first transistor TR1 and the second transistor TR2 may be integrally formed on the basis of or in the same substrate, and by using the same channel material.

The first transistor TR1 includes a first channel region CH1, a first gate electrode GA1 that faces and is spaced apart from the first channel region CH1, and a first memory layer ME1 arranged between the first channel region CH1 and the first gate electrode GA1.

The first memory layer ME1 may include a ferroelectric material. Ferroelectrics refer to a material having ferroelectricity that maintains spontaneous polarization such that internal electric dipole moments are aligned even when an external electric field is not applied. Ferroelectrics refer to a material in which a polarization value (or an electric field) remains semi-permanently in a material even when a voltage is returned to 0V after a constant voltage is applied, and accordingly, a non-volatile memory operation may be performed. Ferroelectrics included in the first memory layer ME1 may include one or more oxides of silicon (Si), aluminum (Al), hafnium (Hf), or zirconium (Zr). The ferroelectrics may include one type of material, or two or more types of materials selected from the group consisting of hafnium oxide ($HfO_2$), zirconium oxide ($ZrO_2$), hafnium-zirconium oxide ($Hf_xZr_{1-x}O_2$, only $0<x<1$), and combinations thereof. Such metal oxide may exhibit ferroelectricity even in a highly thin film of several nm level, and may be applied to existing silicon-based semiconductor device processes, thereby having high mass production. The ferroelectrics may include one or more of the above-described oxides as a base material, and may further include one or more of C, Si, Ge, Sn, Pb, Al, Y, La, Gd, Mg, Ca, Sr, Ba, Ti, Zr, Hf, or N as a dopant material.

A first insulating layer DL1 may be arranged between the first memory layer ME1 and the first channel region CH1. The first insulating layer DL1 may include a paraelectric material. Alternatively or additionally, the first insulating layer DL1 may include an oxide of a material included in the first channel region CH1. For example, the first channel region CH1 may include polycrystalline silicon (poly-Si or polysilicon), and the first insulating layer DL1 may include $SiO_2$ or silicon dioxide. The first channel region CH1 may be in or wholly or at least partially within the substrate 110.

The second transistor TR2 includes a second channel region CH2, a second gate electrode GA2 that faces and is spaced apart from the second channel region CH2, and a volatile second memory layer ME2 arranged between the second channel region CH2 and the second gate electrode GA2. The second channel region CH2 may be in or wholly or at least partially within the substrate 110. In some example embodiments, the second channel region CH2 may include exactly the same material as the first channel region CH1, and may or may not include the same dopants. The dopant concentration in the first channel region CH1 may be the same as, or different from, the dopant concentration in the second channel region CH2. The dopant material and/or the conductivity types may be the same, or different, between the first channel region CH1 and the second channel region CH2.

The second memory layer ME2 may include a ferroelectric material or a high-k material. The ferroelectric material and the high-k material may be classified according to the presence/absence/size of residual polarization, a composition of metal oxide, a type and ratio of doping element, a crystalline phase, and the like. The second memory layer ME2 may include the same ferroelectric material as the first memory layer ME1, and in this case, when the second transistor TR2 operates, a voltage, which is less than a level generating polarization switching of a ferroelectric material, may be applied to the second gate electrode GA2.

A second insulating layer DL2 may be arranged between the second memory layer ME2 and the second channel region CH2. The second insulating layer DL2 may include a paraelectric material. Alternatively or additionally, the second insulating layer DL2 may include an oxide of a material included in the second channel region CH2. For example, the second channel region CH2 may include silicon, and the second insulating layer DL2 may include $SiO_2$. The second insulating layer DL2 may include the same material as the first insulating layer DL1. In some example embodiments, the second insulating layer DL2 and the first insulating layer DL1 may include exactly the same material and/or exactly the same dopants at the same concentrations; however, example embodiments are not limited thereto.

The first insulating layer DL1 and the second insulating layer DL2 may be or may correspond to gate insulating layers, may include various types of paraelectric materials and/or high-k materials, and may have a dielectric constant of about 20 to about 70. For example, the first insulating layer DL1 and the second insulating layer DL2 may include one or more of silicon oxide, silicon nitride, aluminum oxide, hafnium oxide, zirconium oxide, metal nitrogen oxide, silicate, aluminate, or the like, or may include a two-dimensional (2D) insulator such as hexagonal boron nitride (h-BN).

The first transistor TR1 and the second transistor TR2 may be formed on the same substrate 110, and the first channel region CH1 and the second channel region CH2 may include the same material. Any one of a source and a drain of the first transistor TR1, and any one of a source and a drain of the second transistor TR2 may be shared. For example, as illustrated in FIG. 1, the substrate 110 may include a first source S1, a first drain D1, a second source S2, and a second drain D2, and the first drain D1 and the second source S2 may share the same region.

The first source S1, the first channel region CH1, the first drain D1, the second source S2, the second channel region CH2, and the second drain D2 may separately be formed by implanting impurities (such as the same or different impurities, at the same or different doses, and/or at the same or different energies) into different regions of the substrate 110, and in this case, the first source S1, the first channel region CH1, the first drain D1, the second source S2, the second channel region CH2, and the second drain D2 may include a material of the substrate 110 as a base material. Alternatively or additionally, the first source S1, the first drain D1, the second source S2, and the second drain D2 may be formed of a conductive material, for example, each may independently include one or more of metal, a metal compound, or conductive polymer.

The substrate 110 may include a semiconductor material. For example, the substrate 110 may include one or more of silicon (Si), germanium (Ge), silicon germanium (SiGe), group III-V semiconductor, silicon carbide (SiC), gallium arsenide (GaAs), indium arsenic (InAs), indium phosphide (InP), or the like. The substrate 110 may be or may include a silicon on insulator (SOI) substrate in which a buried oxide layer is formed inside a silicon substrate. In this case, the first channel region CH1 and the second channel region CH2 may be formed within an upper silicon layer of the SOI substrate, and may be floated by the buried oxide layer.

The first channel region CH1 is electrically connected to the first source S1 and the first drain D1. For example, the first source S1 may be electrically connected to or contact one side of the first channel region CH1, and the first drain D1 may be electrically connected to or contact the other side of the first channel region CH1. For example, the first channel region CH1 may be defined as a region between the first source S1 and the first drain D1 within the substrate 110.

The second channel region CH2 is electrically connected to the second source S2 and the second drain D2. For example, the second source S2 may be electrically connected to or contact one side of the second channel region CH2, and the second drain D2 may be electrically connected to or contact the other side of the second channel region CH2. For example, the second channel region CH2 may be defined as a region between the second source S2 and the second drain D2 within the substrate 110.

The first channel region CH1 and the second channel region CH2 may include at least one of Si, Ge, SiGe, group III-V semiconductor, oxide semiconductor, nitride semiconductor, nitrogen oxide semiconductor, two-dimensional (2D) material, a quantum dot, transition metal dichalcogenide, and organic semiconductor.

The first gate electrode GA1 and the second gate electrode GA2 may include one or more selected from the group consisting of or including metal, metal nitride, metal carbide, polysilicon, and a combination thereof, and may or may not include the same material. For example, the metal may include aluminum (Al), tungsten (W), molybdenum (Mo), titanium (Ti), or tantalum (Ta), the metal nitride may include a titanium nitride (TiN) film or a tantalum nitride (TaN) film, and the metal carbide may include metal carbide doped with (or containing) aluminum or silicon, as a detailed example, may include TiAlC, TaAlC, TiSiC, or TaSiC. The first gate electrode GA1 and the second gate electrode GA2 may have a structure in which a plurality of materials are stacked. For example, one or both of the first gate electrode GA1 and the second gate electrode GA2 may have a stacked structure of a metal nitride layer/metal layer, such as TiN/Al, or a stacked structure of a metal nitride layer/metal carbide layer/metal layer, such as TiN/TiAlC/W. The first gate electrode GA1 and the second gate electrode GA2 may include a titanium nitride (TiN) layer or molybdenum (Mo), and may use various modifications of the above examples. The first gate electrode GA1 and the second gate electrode GA2 may include the same material.

The first transistor TR1 and the second transistor TR2 may be integrally formed on the basis of the same substrate, and by using the same channel material that may or may not be doped in the same manner. For example, the first channel region CH1 and the second channel region CH2 may include the same material, and may have a structure physically connected to each other. In addition, the first insulating layer DL1 and the second insulating layer DL2 may include the same material, and may be formed to have the same thickness. The first memory layer ME1 and the second memory layer ME2 may include the same material and/or different types of materials, and may have the same thickness. The above structure is an example, and is not indispensable for operations of the first transistor TR1 and the second transistor TR2, but a manufacturing process of the hybrid memory device 100 may, in some cases, be easier by selecting the above structure.

The first transistor TR1 may operate as a non-volatile memory device, for example, a flash memory device, and the second transistor TR2 may operate as a volatile memory device, for example, a 1T-DRAM device without a capacitor.

Figure 2A:
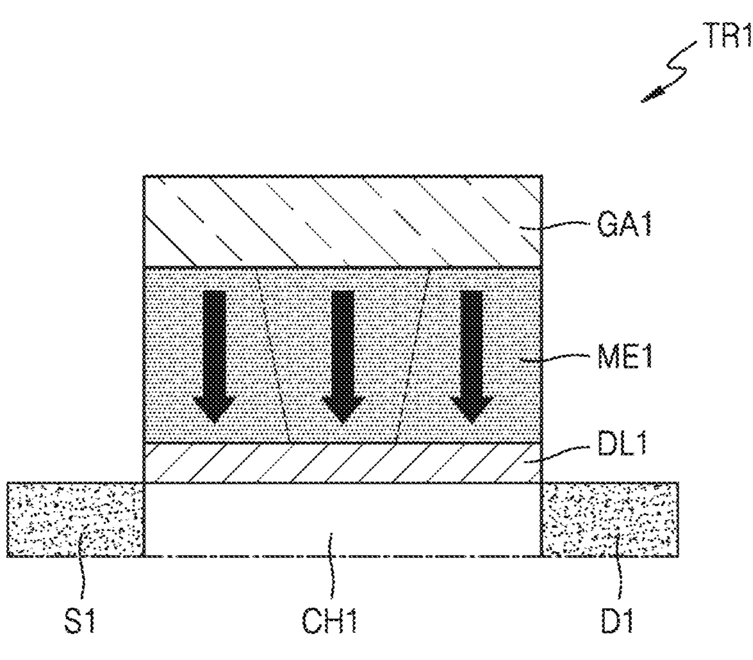
FIGS. 2A to 2C conceptually illustrate a memory operation of a first transistor provided in a hybrid memory device, according to some example embodiments.
Figure 2B:
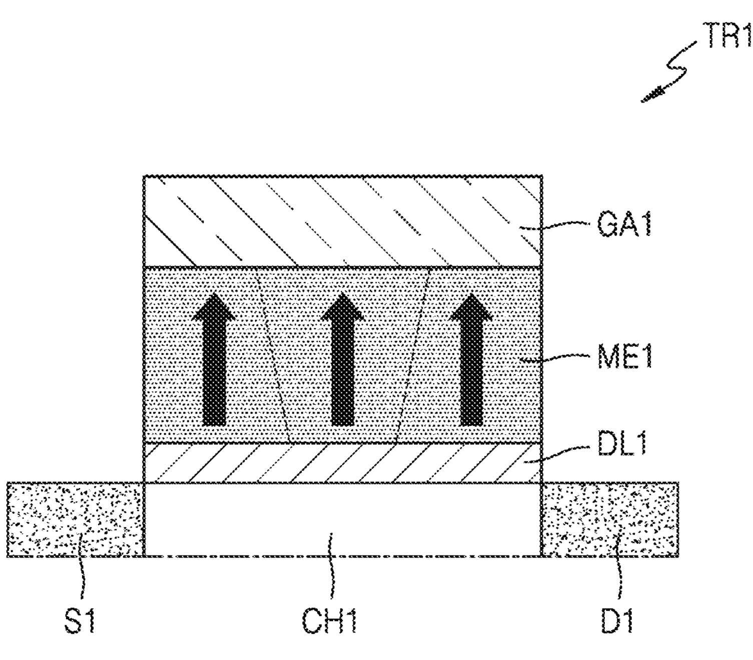
Figure 2C:
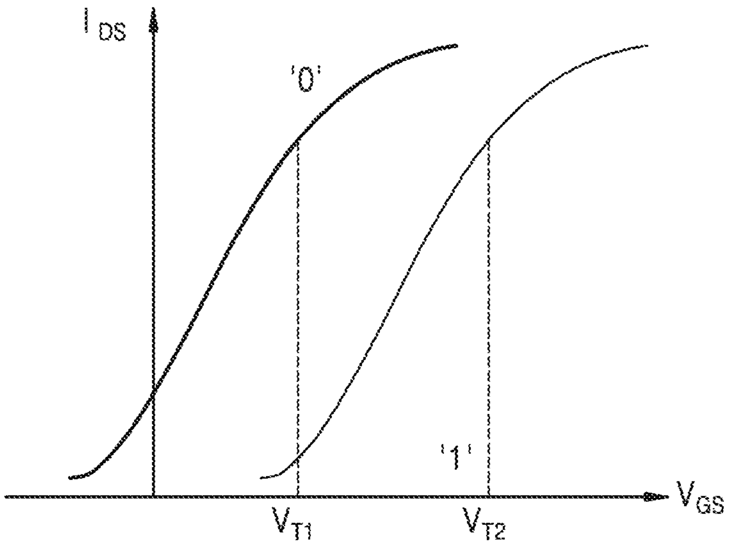

FIGS. 2A to 2C conceptually illustrate a memory operation of a first transistor provided in a hybrid memory device, according to some example embodiments.

Referring to FIGS. 2A and 2B, a polarization direction of an electric dipole domain of a ferroelectric included in a first memory layer ME1 is determined according to a polarity of a voltage applied to a first gate electrode GA1. A threshold voltage may vary according to the polarization direction, and thus, a memory operation may be performed. For the above operation, a voltage, which is greater than or equal to a level generating ferroelectric polarization switching, may be applied to the first gate electrode GA1 of a first transistor TR1.

Referring to FIG. 2A, when a positive voltage, which is greater than or equal to an absolute value of a coercive field (Ec) of a ferroelectric included in the first memory layer ME1, is applied to the first gate electrode GA1, polarization in a first direction corresponding to an electric field direction formed within the ferroelectric may be formed, and a residual polarization value in a first polarization direction may be maintained even when the applied voltage is removed. Here, the first memory layer ME1 may be defined as a state in which data such as a logical "1" is written (or a state in which information is written, and/or an "on" state).

Similarly, referring to FIG. 2B, when a negative voltage, which is greater than or equal to the absolute value of the coercive field (Ec) of the ferroelectric included in the first memory layer ME1, is applied to the first gate electrode GA1, polarization in a second direction corresponding to an electric field direction formed within the ferroelectric may be formed, and a residual polarization value in a second polarization direction may be maintained even when the applied voltage is removed. Here, the first memory layer ME1 may be defined as a state in which data a logical "0" is written (or a state in which information is erased or an "off" state).

Referring to FIG. 2C, different threshold voltages VT1 and VT2 are formed according to a polarization direction of the ferroelectric as described above, and a difference in conductance may occur between a source and a drain, thereby indicating different source-drain currents IDS. Accordingly, information such as logical "0" or information such as logical "1" may be written or identified.

Two types of memory operations of the second transistor TR2 may be performed according to a material of the second memory layer ME2.

When the second memory layer ME2 includes the same ferroelectric as the first memory layer ME1, a memory operation may be performed similarly to that described with reference to FIGS. 2A and 2B. When, for example, a HfZrO-based material is used as a ferroelectric, the second transistor TR2 is sufficient to operate as DRAM because write/erase operations may be performed in several nanoseconds (ns) or less. Meanwhile, in this case, a voltage applied to the second gate electrode GA2 may be less than a voltage forming a coercive field generating ferroelectric polarization switching.

When the second memory layer ME2 includes a material of high permittivity, for example, a paraelectric high-K material, a memory operation may be performed by a method of generating excess holes by impact ionization. A data storage state may be defined according to whether or not the generated excess holes are accumulated in a channel region. The data storage state will be described with reference to FIGS. 3A to 3C.

Figure 3A:
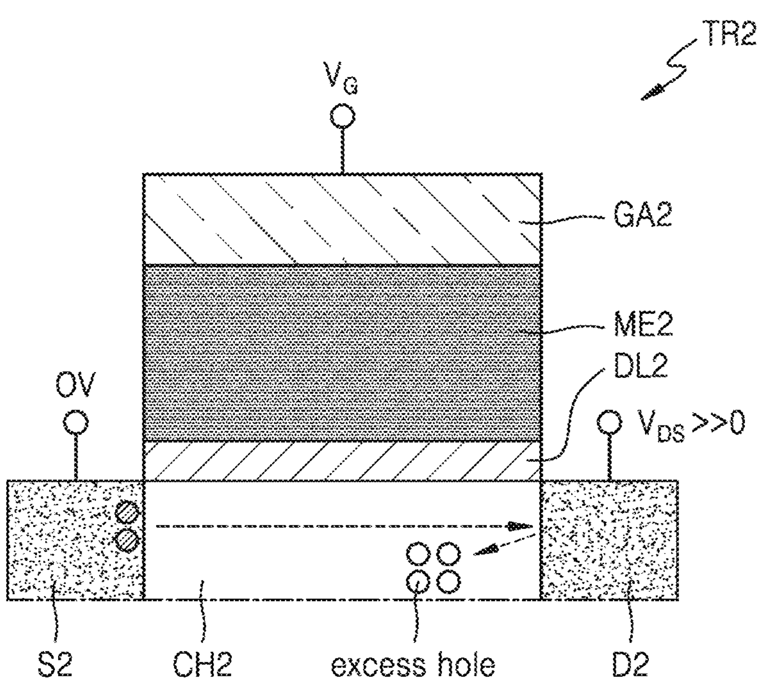
FIGS. 3A to 3C conceptually illustrate a memory operation of a second transistor provided in a hybrid memory device according to some example embodiments.
Figure 3B:
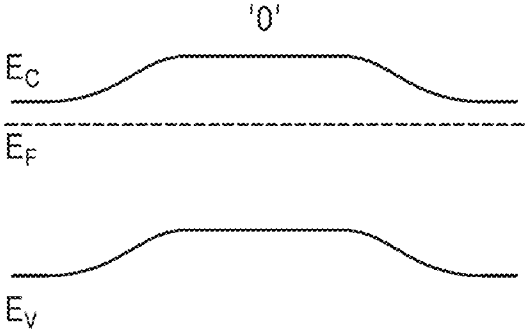
Figure 3C:
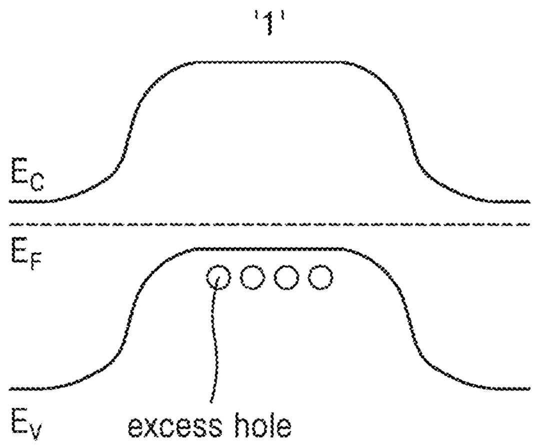

Referring to FIG. 3A, when high voltages are applied to a second gate electrode GA2 and a second drain D2, respectively, excess charge carriers such as excess holes are generated in a second channel region CH2 adjacent to the second drain D2 by impact ionization. The voltage applied to the second drain D2 is a voltage sufficient to generate excess holes, and may be set according to a material of the second channel region CH2, a material and thickness of a second memory layer ME2 and a second insulating layer DL2, and the like. The second channel region CH2 is in a floating state without a body contact, and thus has no path along which charges escape. Therefore, charges are collected at the bottom of the second channel region CH2 in an area which has the lowest potential. In a state in which excess holes are collected and a state in which holes are not collected, as illustrated in FIGS. 3B and 3C, a second transistor TR2 has different energy bands, and a difference occurs in a threshold voltage and a current level. Accordingly, information such as logical "0" or information such as logical "1" may be written or identified.

Even in case that the second memory layer ME2 includes a ferroelectric, the memory operation, as described above, of generating excess holes by impact ionization and/or channel induced secondary electron emission may be also performed.

As illustrated in FIG. 3A, in the second transistor TR2, two layers of the second memory layer ME2 and the second insulating layer DL2 form a gate stack together with the second gate electrode GA2. However, the above stacked structure is an example, and thus, the above-described memory operation may be performed even when a gate stack of the second transistor TR2 includes only one layer including a paraelectric material, a high-k material, or a ferroelectric material.

The hybrid memory device 100 described above may have a structure capable of increasing integration, may operate as a different type of memory, and thus may have a merit of a flash memory having a large storage capacity and concurrently a merit of DRAM having a high operation speed.

Although FIG. 1 illustrates the hybrid memory device 100 including one first transistor TR1 and one second transistor TR2, the number of first transistor TR1 and second transistor TR2 is for convenience of illustration, and in some example embodiments, a plurality of first transistors TR1 and a plurality of second transistors TR2 may be arranged in various forms. In addition, the hybrid memory device 100 may be applied as a memory cell array in which the hybrid memory device 100 is provided as unit memory cell.

Figure 4:
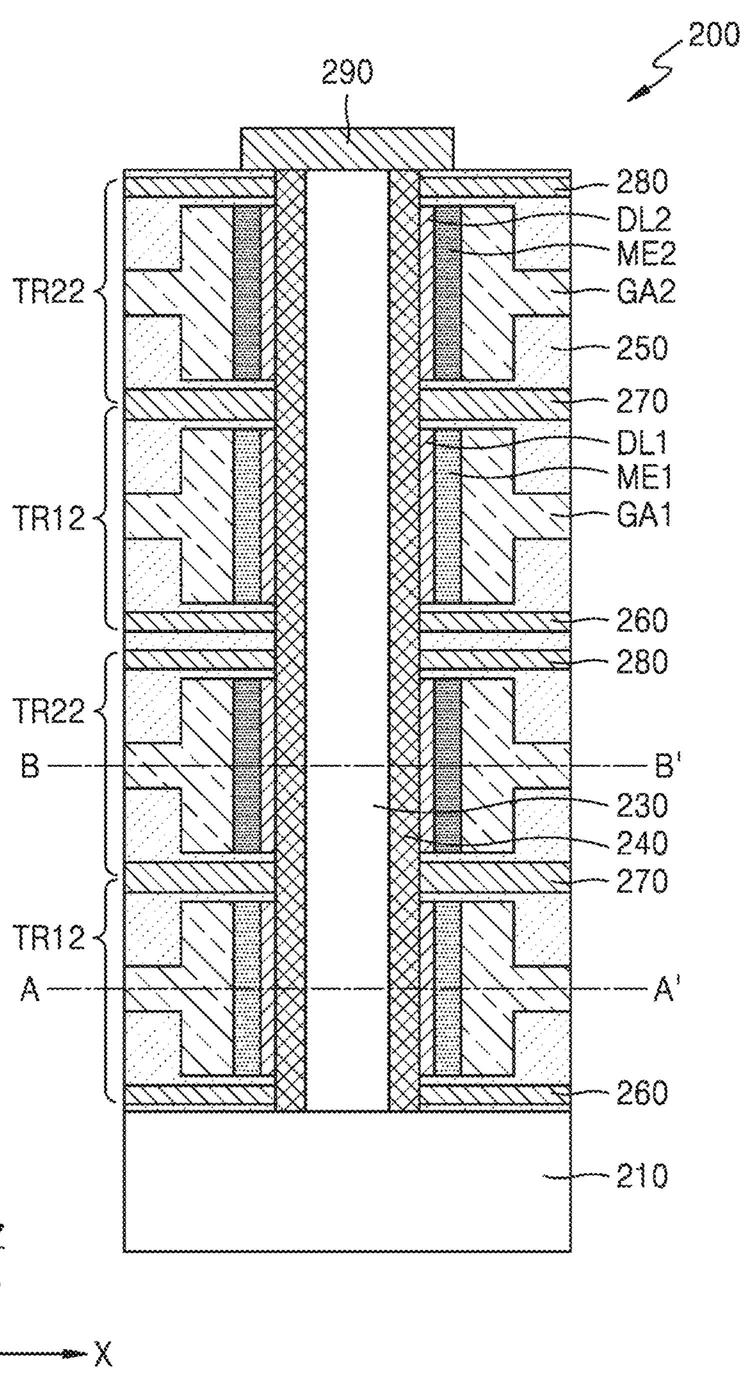
FIG. 4 is a cross-sectional view illustrating a schematic structure of a hybrid memory device according to some example embodiments.
Figure 5A:
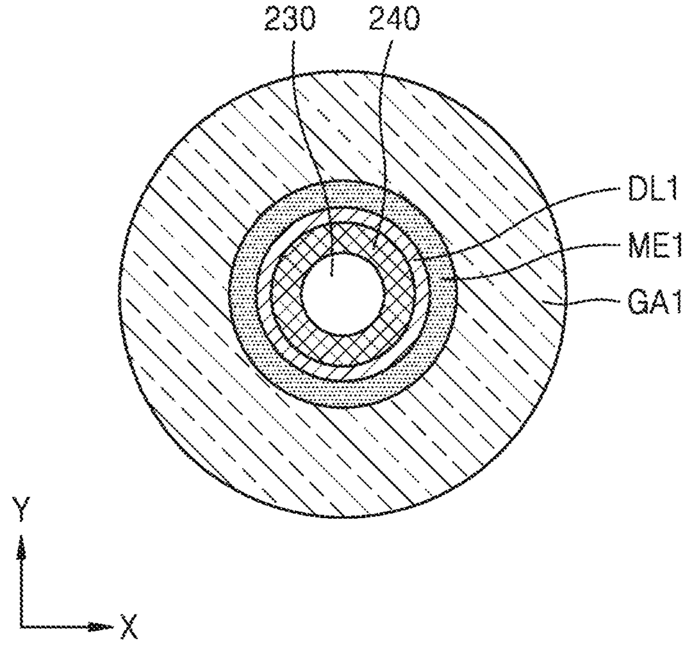
FIGS. 5A and 5B are cross-sectional views taken along lines A-A' and B-B' of FIG. 4, respectively.
Figure 5B:
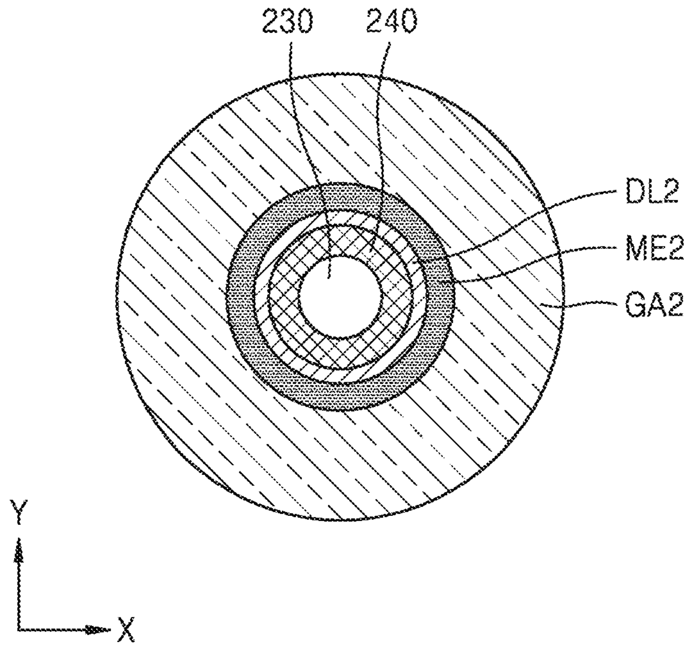

FIG. 4 is a cross-sectional view illustrating a schematic structure of a hybrid memory device according to some example embodiments, and FIGS. 5A and 5B are cross-sectional views taken along lines A-A' and B-B' of FIG. 4, respectively.

Similar to the hybrid memory device 100 described with reference to FIGS. 1 and 2A to 3CA, a hybrid memory device 200 includes a first transistor TR12 and a second transistor TR22 operating as different types of memory devices. For example, the first transistor TR12 may include a first memory layer ME1, and may be controlled to operate as a non-volatile flash memory device, and the second transistor TR22 may include a second memory layer ME2, and may be controlled to operate as 1T-DRAM without a capacitor (e.g., each cell includes a transistor but does not include a capacitor). Operations of the first transistor TR12 and the second transistor TR22 and/or materials included therein are substantially the same as those described above for the hybrid memory device 100, and thus, differences will be mainly described below.

A plurality of first transistors TR12 may be repeatedly arranged in a vertical direction (a Z direction) on a substrate 210, and a plurality of second transistors TR22 may also be repeatedly arranged in the vertical direction (the Z direction) on the substrate 210. The first transistor TR12 and the second transistor TR22 may be alternately arranged with each other.

The substrate 210 may include a semiconductor material. For example, the substrate 210 may include one or more of silicon (Si), germanium (Ge), silicon germanium (SiGe), group III-V semiconductor, silicon carbide (SiC), gallium arsenide (GaAs), indium arsenic (InAs), indium phosphide (InP), or the like. The substrate 210 may be a silicon on insulator (SOI) substrate in which a buried oxide layer is formed inside a silicon substrate.

Channel regions of a plurality of first transistors TR12 and a plurality of second transistors TR22 are connected to each other in a direction (the Z direction) perpendicular to the substrate 210 to form a vertical channel 240 on the substrate 210. The vertical channel 240 may have a cylindrical shape. The vertical channel 240 may be formed to have a shape surrounding a cylinder surface of a cylindrical insulator 230 disposed on the substrate 210.

The first transistor TR12 includes a first insulating layer DL1, a first memory layer ME1, and a first gate electrode GA1 sequentially surrounding the cylinder surface of the vertical channel 240. The first transistor TR12 also includes a first electrode 260 and a second electrode 270 electrically connected to two regions of the vertical channel 240 that are spaced apart from each other.

The second transistor TR22 includes a second insulating layer DL2, a second memory layer ME2, and a second gate electrode GA2 sequentially surrounding the cylinder surface of the vertical channel 240. The second insulating layer DL2, the second memory layer ME2, and the second gate electrode GA2 surround the cylinder surface of the vertical channel 240 at a different height location than the first insulating layer DL1, the first memory layer ME1, and the first gate electrode GA1. The second transistor TR22 also includes the second electrode 270 and a third electrode 280 electrically connected to the two regions of the vertical channel 240 that are spaced apart from each other.

Each of the first electrode 260, the second electrode 270, and the third electrode 280 may be in electrical contact with the vertical channel 240 through a source (not shown) or a drain (not shown). The second electrode 270 may be an electrode shared by the first transistor TR12 and the second transistor TR22, and may be formed to be in electrical contact with a source or drain shared between the first transistor TR12 and the second transistor TR22.

Insulating layers 250 may be respectively arranged between the first gate electrode GA1 and the second gate electrode GA2, between the first electrode 260 and the second electrode 270, and between the second electrode 270 and the third electrode 280.

One end of the vertical channel 240 may be connected to a bitline 290. The first gate electrode GA1 and the second gate electrode GA2 may be connected to different wordlines (not shown), respectively.

As illustrated, the hybrid memory device 200 has the form of one string line in which two first transistors TR12 and two second transistors TR22 are arranged, but is not limited thereto. The string line may include a greater number of first transistors TR12 and second transistors TR22, and a plurality of string lines may be provided and two-dimensionally arranged to form a memory cell array.

In the illustrated hybrid memory device 200, the first transistor TR12 and the second transistor TR22 are arranged alternately one by one, but the arrangement is an example and other arrangements may be made. For example, two or more first transistors TR12 and two or more second transistors TR22 may also be alternately arranged. Alternatively, a plurality of first transistors TR12 and a plurality of second transistors TR22 may be arranged by dividing a region of the hybrid memory device 200 in half to form, for example, a flash memory region and a 1T-DRAM region.

Figure 6:
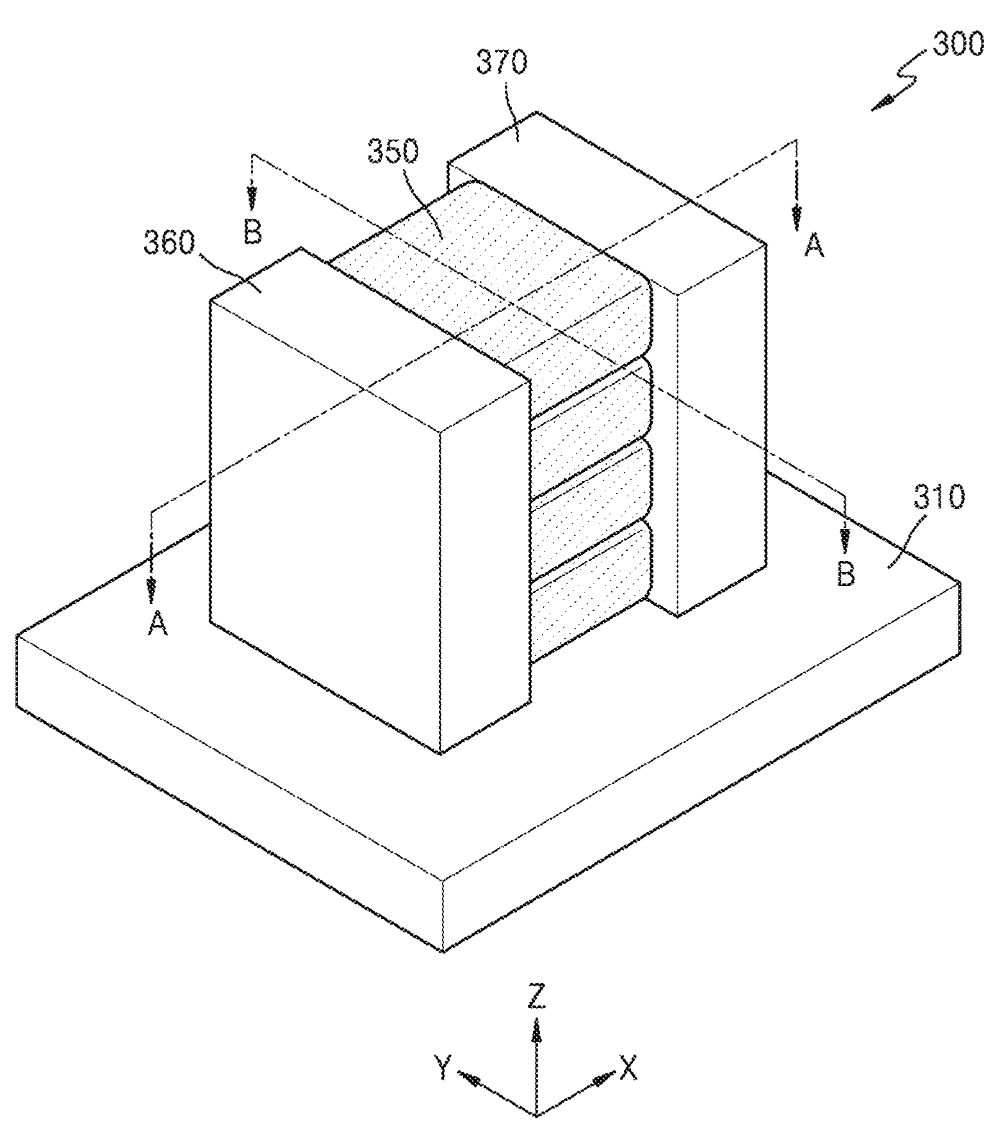
FIG. 6 is a perspective view illustrating a schematic external appearance of a hybrid memory device according to some example embodiments.
Figure 7A:
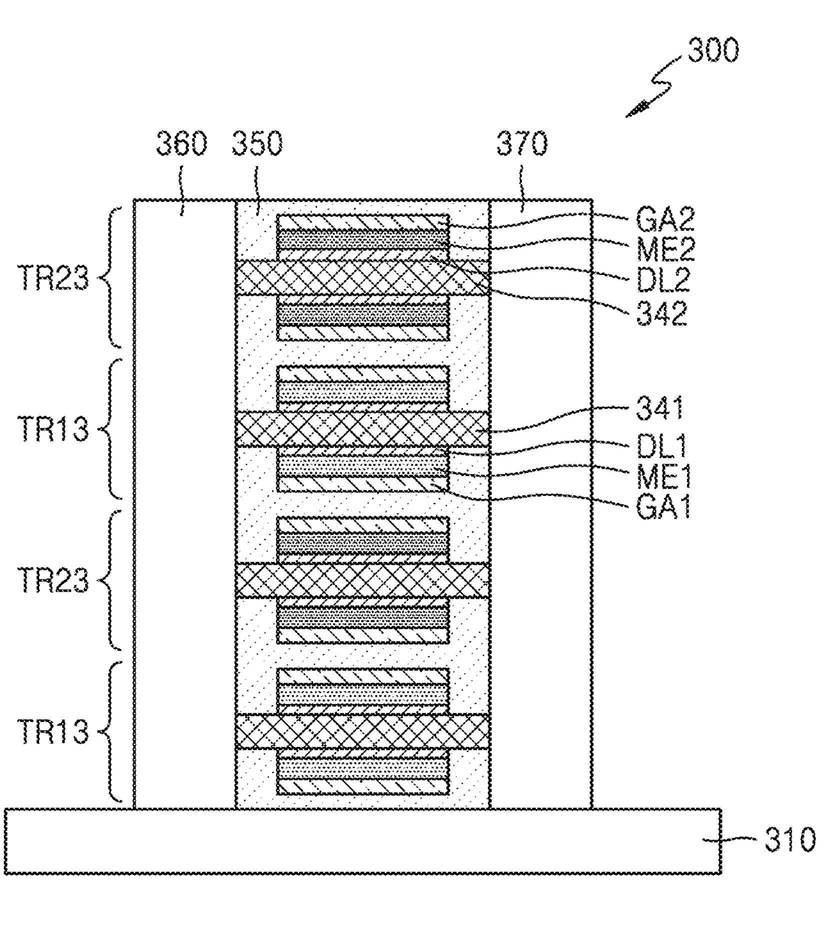
FIGS. 7A and 7B are cross-sectional views illustrating a detailed structure of the hybrid memory device of FIG. 6 from different cross-sections.
Figure 7A:
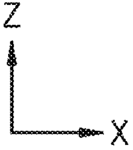
Figure 7B:
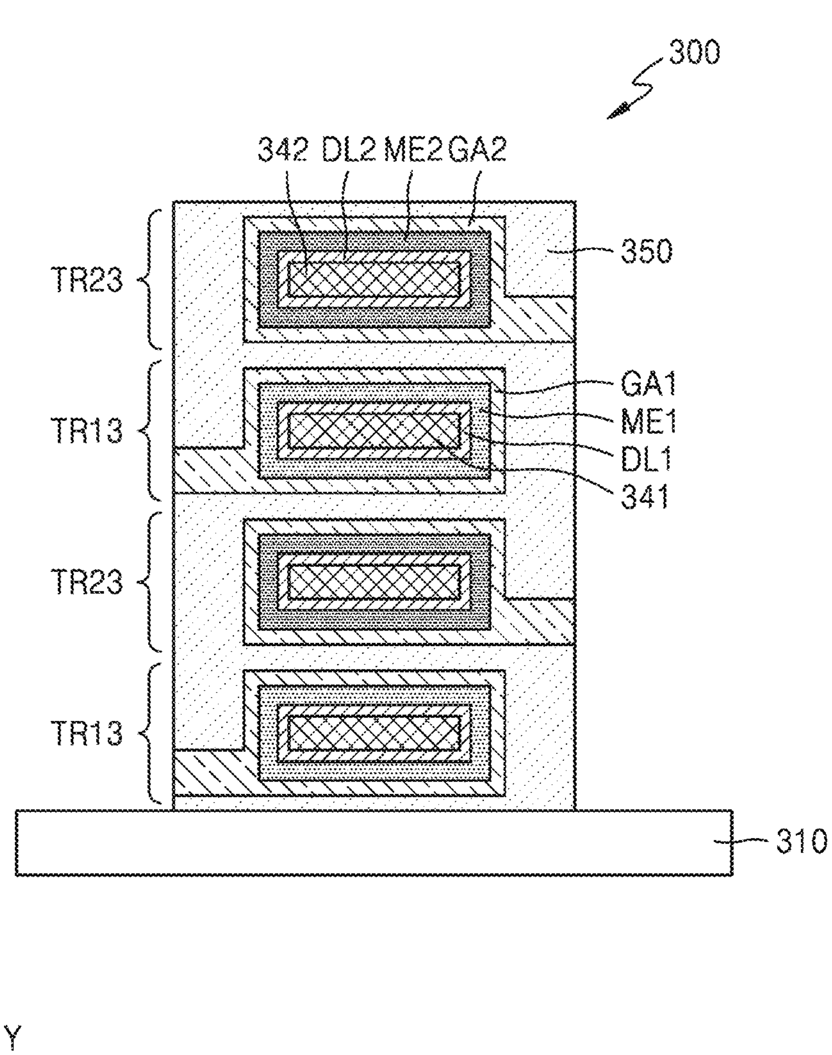

FIG. 6 is a perspective view illustrating a schematic external appearance of a hybrid memory device according to some example embodiments, and FIGS. 7A and 7B are cross-sectional views illustrating a detailed structure of the hybrid memory device of FIG. 6 from different cross sections.

A hybrid memory device 300 includes a first transistor TR13 and a second transistor TR23 operating as different types of memory devices, similar to those described with reference to FIG. 1, but differs from the hybrid memory devices 100 and 200 described above in terms of having a multi-bridge channel shape for a multi-bridge channel field effect transistor (MBCFET™). In other words, the first transistor. TR13 may include a first memory layer ME1, and may be controlled to operate as a non-volatile flash memory device, and the second transistor TR23 may include a second memory layer ME2, and may be controlled to operate as 1T-DRAM. Operations of the first transistor TR13 and the second transistor TR23, the materials included therein, and/or the like are substantially the same as those described above for the hybrid memory device 100.

A structure of the hybrid memory device 300 will be mainly described below on the basis of the differences from the embodiments described above.

A source electrode 360 and a drain electrode 370 are spaced apart from each other on a substrate 310, and a first channel region 341 and a second channel region 342 are arranged between the source electrode 360 and the drain electrode 370. The first channel region 341 and the second channel region 342 are spaced apart from each other on the substrate 310 in a first direction (a Z direction) away from the substrate 310, and both ends of each of the first channel region 341 and the second channel region 342 are in electrical contact with the source electrode 360 and the drain electrode 370.

The first memory layer ME1 of the first transistor TR13 has a shape surrounding the first channel region 341. For example, the first memory layer ME1 may have a central axis parallel to a second direction perpendicular to the first direction, for example, an X direction, and may surround the first channel region 341. A first insulating layer DL1 may be arranged between the first memory layer ME1 and the first channel region 341. The first gate electrode GA1 may have a shape surrounding the first memory layer ME1.

The second memory layer ME2 of the second transistor TR23 has a shape surrounding the second channel region 342. For example, the second memory layer ME2 may have a central axis parallel to the second direction perpendicular to the first direction, for example, the X direction, and may surround the second channel region 342. A second insulating layer DL2 may be arranged between the second memory layer ME2 and the second channel region 342. The second gate electrode GA2 may have a shape surrounding the second memory layer ME2.

An insulating layer 350 may be arranged in a region between the first gate electrode GA1 and the second gate electrode GA2.

Such a multi-bridge type channel may be used as a method of reducing a short channel effect. A short channel effect may include phenomena such as one or more of threshold voltage variation, carrier velocity saturation, and deterioration of the subthreshold characteristics that may occur when sizes of transistors decrease with an increase in the integration of electronic devices and accordingly, a channel length decreases. The multi-bridge type channel may reduce the short channel effect, and may effectively reduce the channel length. The above structure may also maintain a uniform source/drain junction capacitance regardless of a location of a channel.

In the illustrated hybrid memory device 300, the first transistor TR13 and the second transistor TR23 are arranged alternately one by one, but the arrangement is an example and other arrangements may be made. For example, two or more first transistors TR13 and two or more second transistors TR23 may be alternately arranged. Alternatively, a plurality of first transistors TR13 and a plurality of second transistors TR23 may be arranged by dividing a region of the hybrid memory device 300 in half to form, for example, a flash memory region and a 1T-DRAM region.

Figure 8:
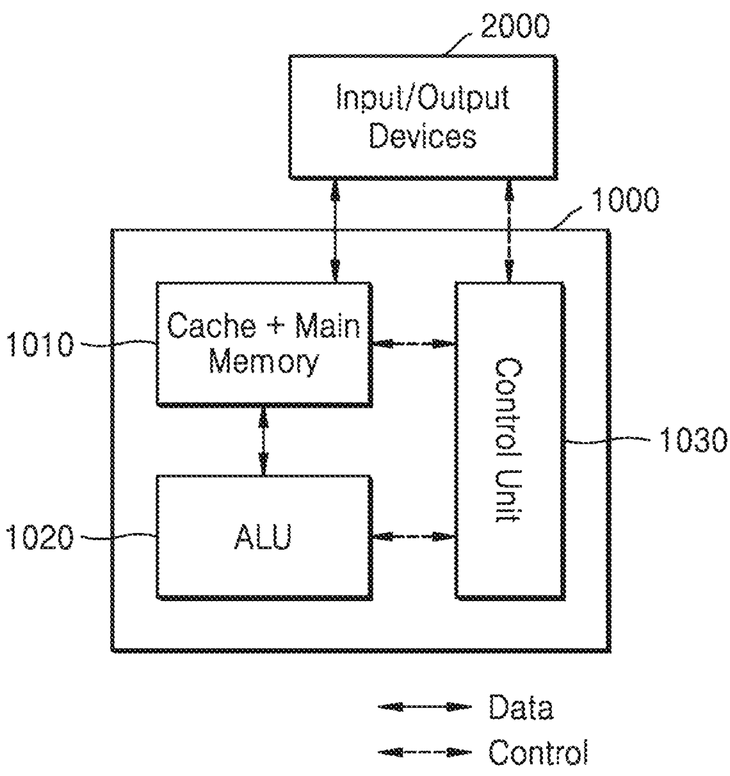
FIGS. 8 and 9 are block diagrams schematically illustrating a device architecture that may be applied to an electronic device, according to embodiments.
Figure 9:
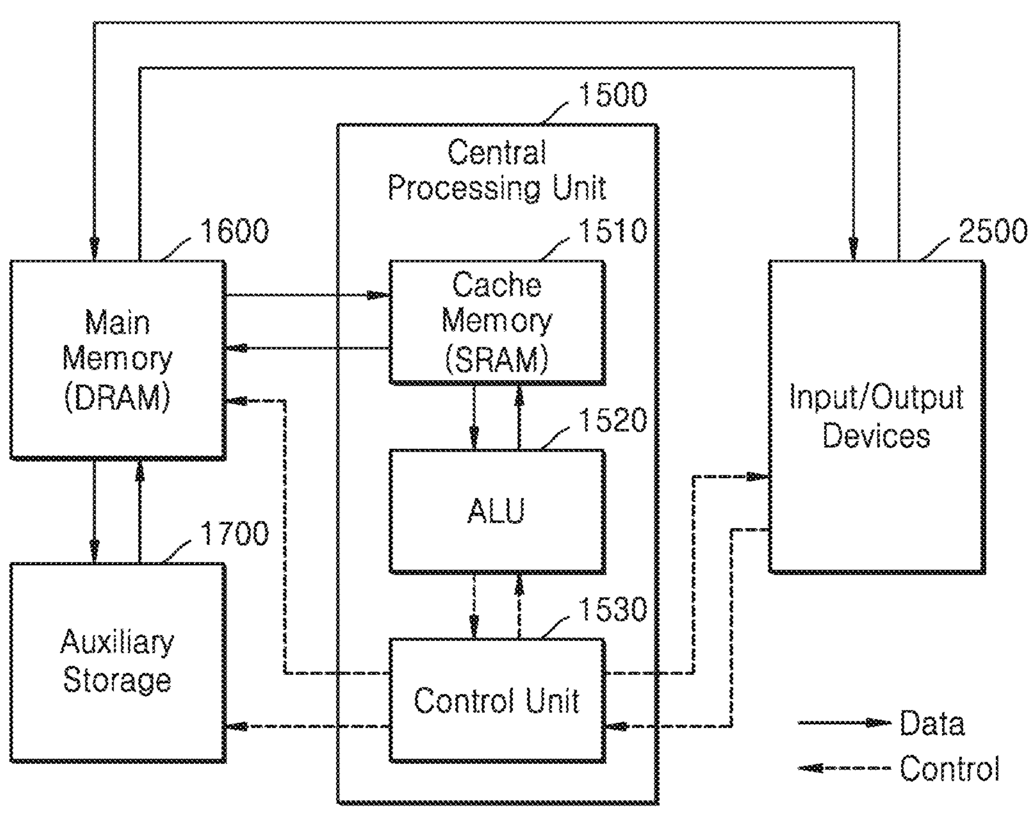

FIGS. 8 and 9 are block diagrams schematically illustrating a device architecture that may be applied to an electronic device, according to embodiments.

Referring to FIG. 8, an electronic device architecture 1000 may include a memory unit 1010 and a control unit 1030, and may further include an arithmetical logic unit (ALU) 1020. The memory unit 1010, the ALU 1020, and the control unit 1030 may be electrically connected to each other. For example, the electronic device architecture 1000 may be implemented as a single chip including the memory unit 1010, the ALU 1020, and the control unit 1030. In detail, the memory unit 1010, the ALU 1020, and the control unit 1030 may be interconnected through a metal line in an on-chip to directly communicate with each other. The memory unit 1010, the ALU 1020, and the control unit 1030 may be monolithically integrated on a single substrate to constitute a single chip. Input/output devices 2000 may be connected to the electronic device architecture (chip) 1000. In addition, the memory unit 1010 may include both a main memory and a cache memory. The electronic device architecture (chip) 1000 may be an on-chip memory processing unit.

The memory unit 1010, the ALU 1020, and/or the control unit 1030 may each separately include the hybrid memory device 100, 200, or 300 described above.

Referring to FIG. 9, a cache memory 1510, an ALU 1520, and a control unit 1530 may constitute a central processing unit (CPU) 1500, and the cache memory 1510 may be or include a static random access memory (SRAM). Separately from the CPU 1500, a main memory 1600 and an auxiliary storage 1700 may be provided, and input/output devices 2500 may be provided. The main memory 1600 may be or may include a dynamic random access memory (DRAM), and may include an electronic device using a semi-ferroelectric thin film structure as described above, for example, a capacitor.

In some cases, an electronic device architecture may be implemented in a form in which computing unit devices and memory unit devices are adjacent to each other in a single chip without any distinction between sub-units.

Although the above-described hybrid memory device has been described with reference to various example embodiments shown in the drawings, this is merely an example, and it will be understood by one of ordinary skill in the art that various modifications and equivalent embodiments may be made. Therefore, the embodiments should be considered in an illustrative sense rather than a restrictive sense. The scope of the disclosure should be defined by claims, rather than by the above description, and all differences within the scope equivalent thereto should be construed as being included.

A hybrid memory device described above includes two transistors that are formed on the basis of a single substrate and operate as different types of memories, and thus, the integration thereof may be efficiently increased.

The hybrid memory device described above may be controlled by different gate electrodes, may operate as a flash memory device and a 1T-DRAM device without a capacitor for each unit cell, and thus may have both a merit of a flash memory having a large storage capacity and a merit of DRAM having a high operation speed.

The above-described hybrid memory device may be easily manufactured on the basis of the same substrate, and may be used as a highly integrated combined memory system.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

It should be understood that embodiments described herein should be considered in a descriptive sense only and not for purposes of limitation. Descriptions of features or aspects within each embodiment should typically be considered as available for other similar features or aspects in other example embodiments, and example embodiments are not necessarily mutually exclusive with one another. While one or more embodiments have been described with reference to the figures, it will be understood by those of ordinary skill in the art that various changes in form and details may be made therein without departing from the spirit and scope as defined by the following claims.

What is claimed is:

1. A hybrid memory device comprising:

a first transistor comprising a first channel region, a first gate electrode facing and spaced apart from the first channel region, and a non-volatile first memory layer between the first channel region and the first gate electrode; and a second transistor comprising a second channel region including a same material as the first channel region, a second gate electrode facing and spaced apart from the second channel region, and a volatile second memory layer between the second channel region and the second gate electrode, wherein the non-volatile first memory layer and the volatile second memory layer include different materials, and a gate insulating layer of the first transistor is isolated from a gate insulating layer of the second transistor.

2. The hybrid memory device of claim 1, wherein the first transistor is configured to operate as a flash memory cell, and the second transistor is configured to operate as a dynamic random access memory (DRAM) cell.

3. The hybrid memory device of claim 2, wherein the first memory layer includes a ferroelectric material.

4. The hybrid memory device of claim 3, wherein the hybrid memory device is configured such that when the first transistor operates, a voltage, which is greater than or equal to a level generating polarization switching of the ferroelectric material, is applied to the first gate electrode.

5. The hybrid memory device of claim 1, wherein the second memory layer includes at least one of a ferroelectric material, a paraelectric material, or a high-k material.

6. The hybrid memory device of claim 1, wherein the hybrid memory device is configured such that when the second transistor operates, a voltage, which has a level sufficient to form excess charge carriers in the second channel region, is applied to a drain of the second transistor.

7. The hybrid memory device of claim 1, wherein the first transistor further includes a first insulating layer between the first memory layer and the first channel region.

8. The hybrid memory device of claim 7, wherein the second transistor further includes a second insulating layer between the second memory layer and the second channel region, the second insulating layer including a same material as the first insulating layer.

9. The hybrid memory device of claim 8, wherein the first channel region and the second channel region include polycrystalline silicon (polysilicon), and the first insulating layer and the second insulating layer include $SiO_2$.

10. The hybrid memory device of claim 1, wherein any one of a source and a drain of the first transistor are shared with any one of a source and a drain of the second transistor.

11. The hybrid memory device of claim 1, wherein the first channel region and the second channel region are arranged as vertical channels connected to each other in a second direction perpendicular to a first direction in which the first channel region and the first gate electrode are spaced apart from each other, and the first transistor and the second transistor are arranged in the second direction.

12. The hybrid memory device of claim 11, wherein the vertical channels have a cylindrical shape having a height in the second direction, the first memory layer and the first gate electrode have a shape surrounding the cylindrical shape, and the second memory layer and the second gate electrode have a shape surrounding the cylindrical shape at a different height location.

13. The hybrid memory device of claim 11, further comprising:

a plurality of the first transistors; and a plurality of the second transistors, wherein the plurality of the first transistors and the plurality of the second transistors are alternately arranged in the second direction.

14. The hybrid memory device of claim 1, further comprising:

a substrate including a source electrode and a drain electrode spaced apart from each other, wherein the first channel region and the second channel region are spaced apart from each other between the source electrode and the drain electrode in a first direction away from the substrate.

15. The hybrid memory device of claim 14, wherein the first memory layer has a shape surrounding the first channel region, and the second memory layer has a shape surrounding the second channel region.

16. The hybrid memory device of claim 14, further comprising:

a plurality of the first transistors; and a plurality of the second transistors, wherein the plurality of the first transistors and the plurality of the second transistors are alternately arranged in the first direction.

17. The hybrid memory device of claim 3, wherein the ferroelectric material included in the first memory layer includes at least one of an oxide of hafnium (Hf) or an oxide of zirconium (Zr).

18. The hybrid memory device of claim 17, wherein the ferroelectric material included in the first memory layer further includes, in the oxide, at least one dopant material, the at least one dopant material being at least one of Si, Al, Y, La, Gd, Mg, Ca, Sr Ba, Ti, Zr, Hf, or N.

19. The hybrid memory device of claim 1, wherein the first channel region includes at least one of Si, Ge, SiGe, group III-V semiconductor, oxide semiconductor, nitride semiconductor, nitrogen oxide semiconductor, two-dimensional (2D) material, a quantum dot, transition metal dichalcogenide, and organic semiconductor.

20. An electronic device comprising:

a memory device; and a controller electrically connected to the memory device, and configured to control the memory device, wherein at least one of the memory device or the controller includes a hybrid memory device, the hybrid memory device comprising:

a first transistor comprising a first channel region, a first gate electrode facing and spaced apart from the first channel region, and a non-volatile first memory layer between the first channel region and the first gate electrode; and a second transistor comprising a second channel region including a same material as the first channel region, a second gate electrode facing and spaced apart from the second channel region, and a volatile second memory layer between the second channel region and the second gate electrode, wherein the non-volatile first memory layer and the volatile second memory layer include different materials, and a gate insulating layer of the first transistor is isolated from a gate insulating layer of the second transistor.

21. A hybrid memory device comprising:

a first transistor comprising a first channel region, a first gate electrode facing and spaced apart from the first channel region, and a non-volatile first memory layer between the first channel region and the first gate electrode; and a second transistor comprising a second channel region including a same material as the first channel region, a second gate electrode facing and spaced apart from the second channel region, and a volatile second memory layer between the second channel region and the second gate electrode, wherein the non-volatile first memory layer includes ferroelectric material and the volatile second memory layer includes a high-k material.

* * * * *